(12) United States Patent
Jemili et al.

(10) Patent No.: US 12,013,413 B2
(45) Date of Patent: Jun. 18, 2024

(54) MICROELECTROMECHANICAL ACCELERATION SENSOR SYSTEM

(71) Applicant: Robert Bosch GmbH, Stuttgart (DE)

(72) Inventors: Amin Jemili, Kusterdingen (DE); Falk Roewer, Reutlingen-Betzingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 313 days.

(21) Appl. No.: 17/647,551

(22) Filed: Jan. 10, 2022

(65) Prior Publication Data

US 2022/0236299 A1   Jul. 28, 2022

(30) Foreign Application Priority Data

Jan. 28, 2021   (DE) .................. 10 2021 200 764.3

(51) Int. Cl.
| | |
|---|---|
| *G01P 15/125* | (2006.01) |
| *B81B 7/00* | (2006.01) |
| *G01D 1/16* | (2006.01) |
| *G01P 15/08* | (2006.01) |
| *G01P 15/18* | (2013.01) |
| *H03M 3/00* | (2006.01) |

(52) U.S. Cl.
CPC ............ *G01P 15/125* (2013.01); *B81B 7/007* (2013.01); *G01P 15/18* (2013.01); *B81B 2201/0235* (2013.01); *B81B 2201/0257* (2013.01); *G01D 1/16* (2013.01); *G01P 2015/0865* (2013.01); *H03M 3/30* (2013.01)

(58) Field of Classification Search
None
See application file for complete search history.

(56) References Cited

U.S. PATENT DOCUMENTS

| | | | | |
|---|---|---|---|---|
| 6,498,996 B1 * | 12/2002 | Vallot | ................... | G01C 21/188 |
| | | | | 702/56 |
| 7,650,253 B2 * | 1/2010 | Weed | ...................... | G01P 21/00 |
| | | | | 73/1.78 |
| 2004/0036636 A1 | 2/2004 | Mai et al. | | |

(Continued)

*Primary Examiner* — Lina Cordero
(74) *Attorney, Agent, or Firm* — NORTON ROSE FULBRIGHT US LLP; Gerard A. Messina

(57) ABSTRACT

A microelectromechanical acceleration sensor system including a microelectromechanical acceleration sensor element for detecting acceleration values acting on the acceleration sensor element, a sigma-delta analog-to-digital converter for converting the analog output signals of the acceleration sensor element into digital output signals, and a first signal generator element and a second signal generator element. The first signal generator element is connected between the acceleration sensor element and the analog-to-digital converter and being configured to apply a predetermined signal value to the output signals of the acceleration sensor element. The signal value of the first signal generator element corresponding to an acceleration value that is greater than the average gravity acceleration, and the second signal generator element being connected in a signal processing direction downstream from the analog-to-digital converter and being configured to correct the digital output signals of the analog-to-digital converter by the signal value of the first signal generator element.

10 Claims, 1 Drawing Sheet

(56) References Cited

U.S. PATENT DOCUMENTS

2009/0281756 A1* 11/2009 Weed ................... G01P 15/18
702/104
2012/0043974 A1 2/2012 van den Boom et al.
2019/0174234 A1* 6/2019 Wu ..................... H04R 19/04

* cited by examiner

MICROELECTROMECHANICAL ACCELERATION SENSOR SYSTEM

CROSS REFERENCE

The present application claims the benefit under 35 U.S.C. § 119 of German Patent Application No. DE 10 2021 200 764.3 filed on Jan. 28, 2021, which is expressly incorporated herein by reference in its entirety.

FIELD

The present invention relates to a microelectromechanical acceleration sensor system and an electronic device including a microelectromechanical acceleration sensor system.

BACKGROUND INFORMATION

So-called in-ear headphones that are worn wirelessly directly in the ear are a very significant technology trend right now. In one possible technical specific embodiment, these in-ear headphones have multiple microphones and acceleration sensors. The acceleration sensors must be operable in such a way that measured signals of the sensors do not generate perceptible tones. Due to their high performance and good signal-to-noise ratio, sigma-delta analog-to-digital converters (SD-ADCs) are increasingly used in this field. In sigma-delta analog-to-digital converters, the development of an undesirable so-called idle tone behavior is a known problem, however, in the case of which oscillations that may be significantly above the general noise background signal of the sensor and may generate a tone that is audible for the human ear may be measurable when an idle signal, i.e., a signal having a disappearing signal intensity, is applied in the noise power spectrum of the SD-ADC.

SUMMARY

It is an object of the present invention to provide an improved microelectromechanical acceleration sensor system and an electronic device including a microelectromechanical acceleration sensor system.

This object may be achieved by the microelectromechanical acceleration sensor system and by the electronic device in accordance with example embodiments of the present invention. Advantageous embodiments of the present invention are disclosed herein.

According to one aspect of the present invention, a microelectromechanical acceleration sensor system including a microelectromechanical acceleration sensor element for detecting acceleration values acting on the acceleration sensor element, a sigma-delta analog-to-digital converter for converting the analog output signals of the acceleration sensor element into digital output signals of the sensor system, and a first signal generator element and a second signal generator element are provided, the first signal generator element being connected between the acceleration sensor element and the analog-to-digital converter and being configured to apply a predetermined signal value to the output signals of the acceleration sensor element, the signal value of the first signal generator element corresponding to an acceleration value that is greater than the average gravity acceleration, and the second signal generator element being connected in a signal processing direction downstream from the analog-to-digital converter and being configured to correct the digital output signals of the analog-to-digital converter by the signal value of the first signal generator element.

In this way, the technical advantage may be achieved that an improved microelectromechanical acceleration sensor system may be provided, in which an idle tone of a sigma-delta analog-to-digital converter may be prevented. Via a first signal generator element a signal value that corresponds to an acceleration value that is greater than the average gravity acceleration is applied to the output signals of an acceleration sensor element of the microelectromechanical acceleration sensor system. By applying the above-mentioned signal value to the output signals of the acceleration sensor element it is achieved that in the resting position of the acceleration sensor system, in which merely the gravity acceleration acts on the acceleration sensor system, it is prevented that a zero signal is output by the acceleration sensor element to the analog-to-digital converter. By applying the signal value to the output signals of the acceleration sensor element, signals that are different from zero at any given time are output to the analog-to-digital converter, so that an idle tone of the analog-to-digital converter is prevented that occurs only if the analog-to-digital converter is in an idle state, in which a zero signal acts on the analog-to-digital converter. Due to the fact that the signal value is greater than the average gravity acceleration, it is ensured in any resting position of the acceleration sensor system that signals that are different from zero act on the analog-to-digital converter.

According to one specific embodiment, the signal value corresponds to twice the gravity acceleration.

In this way, the technical advantage may be achieved that the signals acting on the analog-to-digital converter have a preferably large distance to the zero signal, so that it may be ensured with increased reliability that the analog-to-digital converter is not in the idle state and thus does not produce an idle tone.

According to one specific embodiment of the present invention, the first signal generator element is configured to apply the predetermined signal value exclusively to the output signals of the acceleration sensor element that correspond to the zero signal.

In this way, the technical advantage may be achieved that a precise analog-to-digital conversion may be achieved in that the output signals are exclusively applied if an idle tone is to be suspected from the analog-to-digital converter. For the output signals of the acceleration sensor element that are different from zero no application takes place. In this way, errors due to application may be prevented, thus contributing to an increased precision of the acceleration sensor system.

According to one specific embodiment of the present invention, the acceleration sensor element is designed as a three-dimensional acceleration sensor element including three measuring channels, the first signal generator element being configured to apply the signal value to the output signals of each measuring channel of the acceleration sensor element and the second signal generator element being configured to correct the digital output signals of the analog-to-digital converter by the signal value for each measuring channel.

In this way, the technical advantage may be achieved that for any arbitrary position of the acceleration sensor system an application of the predetermined signal value to the particular output values of the acceleration sensor element is made possible and it may thus be prevented for any position of the acceleration sensor system that the analog-to-digital converter produces an idle tone in the idle state.

According to one specific embodiment of the present invention, the signal value includes for each measuring channel of the acceleration sensor a partial signal value, each partial signal value corresponding to an acceleration value that is greater than the average gravity acceleration in a direction in space of the particular measuring channel and the partial signal values of different measuring channels having different values.

In this way, the technical advantage may be achieved that for each measuring channel of the acceleration sensor element an application of the predetermined partial signal value to the particular output values is made possible and it may thus be ensured that an idle tone of the analog-to-digital converter, as a result of a zero signal acting on it, may be prevented in any arbitrary position or orientation of the acceleration sensor system.

According to one specific embodiment of the present invention, the first signal generator element and the second signal generator element are designed as evaluation circuits, in particular as application-specific integrated circuits (ASICs).

In this way, the technical advantage may be achieved that a technically simple implementation of the first and the second signal generator elements is made possible.

According to one specific embodiment of the present invention, the acceleration sensor element is designed as a capacitive acceleration sensor element.

In this way, the technical advantage may be achieved that a technically robust and precise acceleration sensor element may be provided.

According to one specific embodiment of the present invention, the sensor system further includes a capacitance-to-voltage converter, the capacitance-to-voltage converter being connected between the first signal generator element and the analog-to-digital converter and being configured to convert the capacitive output signals of the acceleration sensor element into voltage signals.

In this way, the technical advantage may be achieved that a precise processing of the output signals of the capacitive acceleration sensor element is made possible.

According to one specific embodiment of the present invention, the sensor system is employable as a microphone.

In this way, the technical advantage may be achieved that a preferably wide use of the sensor system according to the present invention is made possible.

According to a second aspect of the present invention, an electronic device including a microelectromechanical acceleration sensor system according to one of the preceding specific embodiments is provided.

In this way, the technical advantage may be achieved that an electronic device including a microelectromechanical acceleration sensor system having the above-mentioned technical advantages may be provided. The electronic device may be an in-ear headphone, for example.

Exemplary embodiments of the present invention are elucidated based on the figures.

DETAILED DESCRIPTION OF EXAMPLE EMBODIMENT

Figure 1:
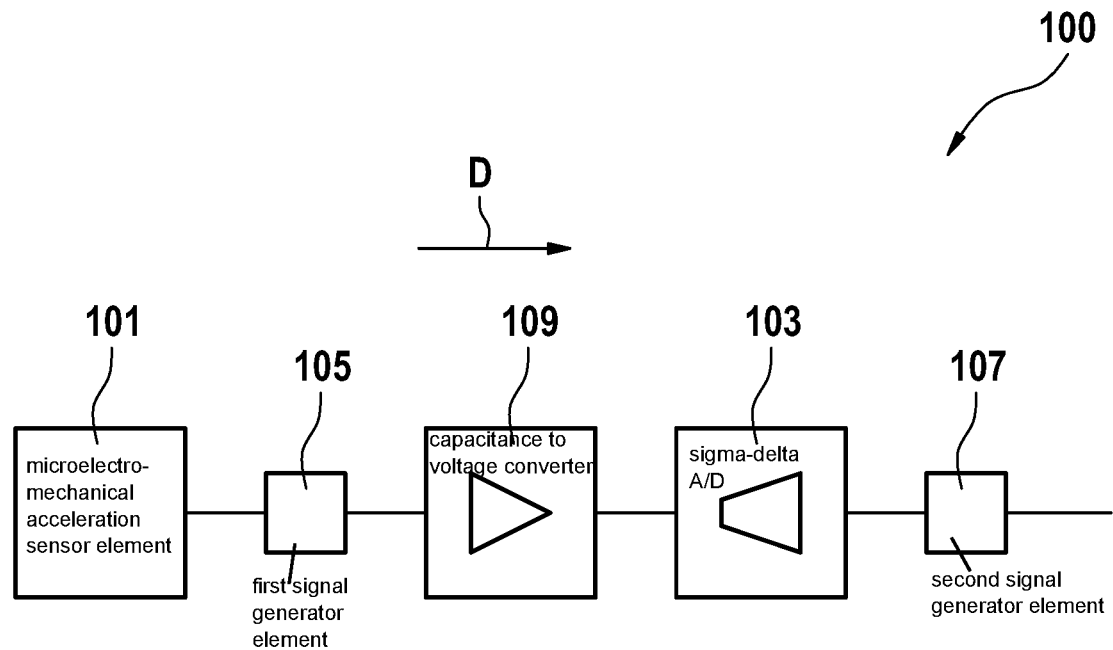
FIG. 1 shows a schematic illustration of a microelectromechanical acceleration sensor system according to one specific embodiment.

FIG. 1 shows a schematic illustration of a microelectromechanical acceleration sensor system 100 according to one specific embodiment of the present invention.

FIG. 1 shows a sequence diagram of a microelectromechanical acceleration sensor system 100 according to the present invention. In the shown specific embodiment, microelectromechanical acceleration sensor system 100 includes a microelectromechanical acceleration sensor element 101, a sigma-delta analog-to-digital converter 103, a first signal generator element 105, a second signal generator element 107, and a capacitance-to-voltage converter 109. First signal generator element 105 is connected between microelectromechanical acceleration sensor element 101 and sigma-delta analog-to-digital converter 103. Second signal generator element 107 is connected in a signal processing direction D downstream from sigma-delta analog-to-digital converter 103. In contrast, capacitance-to-voltage converter 109 is connected between first signal generator element 105 and sigma-delta analog-to-digital converter 103.

In the shown specific embodiment, microelectromechanical acceleration sensor element 101 is designed as a capacitive acceleration sensor element and is configured to detect accelerations of microelectromechanical acceleration sensor system 100 and to output corresponding capacitance signals as output signals to first signal generator element 105.

First signal generator element 105 is configured to apply a predetermined signal value to the output signals of acceleration sensor element 101. In this case, the predetermined signal value corresponds to an acceleration value that is greater than the average gravity acceleration. By applying the predetermined signal value to the output signals of acceleration sensor element 101 it is achieved that in the case of a resting position of microelectromechanical acceleration sensor system 100, in which microelectromechanical acceleration sensor system 100 is not accelerated and in which the gravity acceleration exclusively acts on microelectromechanical acceleration sensor system 100, the output signals of acceleration sensor element 101 have a value different than zero.

The output signals of acceleration sensor element 101 acted on by the predetermined signal value are transferred from first signal generator element 105 to capacitance-to-voltage converter 109. Capacitance-to-voltage converter 109 is configured to convert the capacitive output signals of capacitive acceleration sensor element 101 into voltage signals. The voltage signals converted by capacitance-to-voltage converter 109 are subsequently forwarded to sigma-delta analog-to-digital converter 103.

Sigma-delta analog-to-digital converter 103 is configured to convert the analog output signals of acceleration sensor element 101 into digital output signals of microelectromechanical acceleration sensor system 100. Sigma-delta analog-to-digital converter 103 is configured to carry out the analog-to-digital conversion of the output signals of acceleration sensor element 101 according to a sigma-delta modulation of the analog output signals. In the present specific embodiment, sigma-delta analog-to-digital converter 103 may be a conventional sigma-delta analog-to-digital converter from the related art.

By applying the predetermined signal value to the output signals of acceleration sensor element 101 via first signal generator element 105, the signals of acceleration sensor element 101 acting on sigma-delta analog-to-digital converter 103 as input signals have a value different from zero at any given time. Even in the resting position of acceleration sensor system 100, in which acceleration sensor system 100 is not accelerated and the gravity acceleration exclusively acts on acceleration sensor system 100, the signals acting on sigma-delta analog-to-digital converter 103 have a value different from zero. The signals acting on sigma-delta analog-to-digital converter 103 have as their minimum value at least one difference value between the average gravity acceleration acting on microelectromechanical acceleration sensor system 100 in the resting position and the predetermined signal value that is greater than the average gravity acceleration according to the present invention. As a result of the input signals that are different from zero at any given time and that act on sigma-delta analog-to-digital converter 103 it may be prevented that sigma-delta analog-to-digital converter 103 switches into the idle state, in which exclusively zero signals act on sigma-delta analog-to-digital converter 103. By preventing sigma-delta analog-to-digital converter 103 from switching into the idle state as a result of the zero signals acting on it, it is moreover prevented that an idle tone is produced by sigma-delta analog-to-digital converter 103. Since an idle tone of this type is disturbing to a use of microelectromechanical acceleration sensor system 100 in an in-ear headphone, for which an undesirable noise formation is to be avoided, an improved microelectromechanical acceleration sensor system 100 may be provided.

With the aid of second signal generator element 107, the output signals of acceleration sensor element 101 converted by sigma-delta analog-to-digital converter 103 into digital signals are corrected by the signal value applied by first signal generator element 105. The digital output signals output by microelectromechanical acceleration sensor system 100 thus do not have an additional signal value, so that in the not accelerated resting position of microelectromechanical acceleration sensor system 100, same correctly outputs an acceleration value of zero. The measurement precision of microelectromechanical acceleration sensor system 100 is thus not impaired by the output signals of acceleration sensor element 101 being applied via first signal generator element 105 and the acceleration values output by microelectromechanical acceleration sensor system 100 correspond to those acceleration values measured by acceleration sensor element 101. The application of the predetermined signal value to the output signals of acceleration sensor element 101 via first signal generator element 105 is used exclusively to prevent an idle tone by sigma-delta analog-to-digital converter 103.

According to one specific embodiment, the predetermined signal value of first signal generator element 105 corresponds to twice the gravity acceleration. Alternatively thereto, the predetermined signal value may correspond to any other arbitrary multiple of the gravity acceleration.

According to one specific embodiment, acceleration sensor element 101 is designed as a three-dimensional acceleration sensor element including three measuring channels. In this specific embodiment, first signal generator element 105 is configured to apply a corresponding signal value to the output signals of each measuring channel of acceleration sensor element 101. Second signal generator element 107 is correspondingly configured to correct the digital output signals of sigma-delta analog-to-digital converter 103 by the corresponding signal value for each measuring channel of the three-dimensional acceleration sensor element.

According to one specific embodiment, the signal values, which are applied to the output signals of each measuring channel of acceleration sensor element 101, may have different values. Alternatively thereto, the signal values, which are applied to the output signals of each measuring channel of acceleration sensor element 101, may have an identical value.

According to one specific embodiment, first and second signal generator elements 105, 107 may be designed as application-specific integrated circuits (ASICs).

According to one specific embodiment, microelectromechanical acceleration sensor system 100 is employable as a microphone. In particular, microelectromechanical acceleration sensor system 100 may be used in an in-ear headphone.

According to one specific embodiment, first signal generator element 105 may be designed to apply the predetermined signal value to any output values of acceleration sensor element 101. Alternatively thereto, first signal generator element 105 may be designed to apply a corresponding signal value exclusively to output signals of acceleration sensor element 101 that correspond to the zero signal. Second signal generator element 107 may have a similar design for the purpose of correcting the signal values of first signal generator element 105 for all output signals of sigma-delta analog-to-digital converter 103 or of carrying out a correction of this type exclusively for the output signals of sigma-delta analog-to-digital converter 103 that correspond to the zero signal of acceleration sensor element 101.

Figure 2:
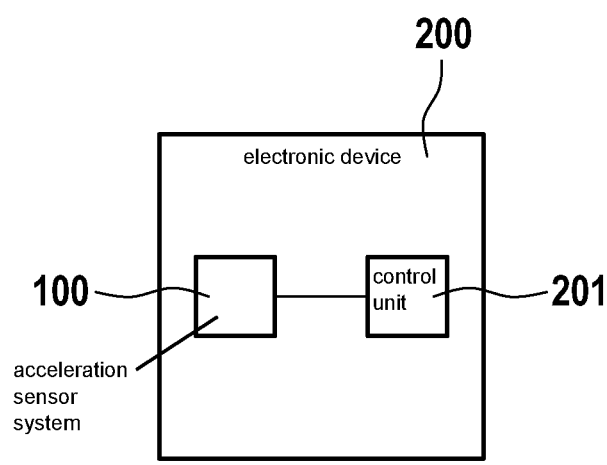
FIG. 2 shows a schematic illustration of an electronic device including a microelectromechanical sensor system according to one specific embodiment.

FIG. 2 shows a schematic illustration of an electronic device 200 including a microelectromechanical sensor system 100 according to one specific embodiment.

In the shown specific embodiment, electronic device 200 includes in addition to acceleration sensor system 100 a control unit 201, which is connected to acceleration sensor system 100 via data technology and is configured to process the sensor values of acceleration sensor system 100. The electronic device may be a consumer electronic device, for example. For example, the electronic device may be an in-ear headphone. The present invention is, however, not intended to be limited thereto.

What is claimed is:

1. A microelectromechanical acceleration sensor system, comprising:
   a microelectromechanical acceleration sensor element configured to detect acceleration values acting on the microelectromechanical acceleration sensor element;
   a sigma-delta analog-to-digital converter configured to convert analog output signals of the microelectromechanical acceleration sensor element into digital output signals of the microelectromechanical acceleration sensor system; and
   a first signal generator element, and a second signal generator element, the first signal generator element being connected between the microelectromechanical acceleration sensor element and the sigma-delta analog-to-digital converter and being configured to apply a predetermined signal value to the analog output signals of the microelectromechanical acceleration sensor element, the predetermined signal value of the first signal generator element corresponding to an acceleration value that is greater than an average gravity acceleration, and the second signal generator element being connected in a signal processing direction downstream from the sigma-delta analog-to-digital converter and being configured to correct the digital output signals of the sigma-delta analog-to-digital converter by the predetermined signal value of the first signal generator element.

2. The microelectromechanical acceleration sensor system as recited in claim 1, wherein the predetermined signal value corresponds to twice a gravity acceleration.

3. The microelectromechanical acceleration sensor system as recited in claim 1, wherein the first signal generator element is configured to apply the predetermined signal value exclusively to the analog output signals of the microelectromechanical acceleration sensor element that correspond to a zero signal.

4. The microelectromechanical acceleration sensor system as recited in claim 1, wherein the microelectromechanical acceleration sensor element is a three-dimensional acceleration sensor system including three measuring channels, the first signal generator element being configured to apply the predetermined signal value to output signals of each measuring channel of the microelectromechanical acceleration sensor element and the second signal generator element being configured to correct the digital output signals of the sigma-delta analog-to-digital converter by the predetermined signal value for each measuring channel.

5. The microelectromechanical acceleration sensor system as recited in claim 4, wherein the predetermined signal value includes, for each measuring channel of the three measuring channels of the microelectromechanical acceleration sensor element, a partial signal value, each partial signal value corresponding to an acceleration value that is greater than the average gravity acceleration in a direction in space of the measuring channel, and partial signal values of different measuring channels having different values.

6. The microelectromechanical acceleration sensor system as recited in claim 1, wherein the first signal generator element and the second signal generator element are evaluation circuits, the evaluation circuits being application-specific integrated circuits (ASICs).

7. The microelectromechanical acceleration sensor system as recited in claim 1, wherein the microelectromechanical acceleration sensor element is a capacitive acceleration sensor element.

8. The microelectromechanical acceleration sensor system as recited in claim 7, further comprising:
a capacitance-to-voltage converter, wherein the capacitance-to-voltage converter is connected between the first signal generator element and the sigma-delta analog-to-digital converter and is configured to convert capacitive output signals of the microelectromechanical acceleration sensor element into voltage signals.

9. The microelectromechanical acceleration sensor system as recited in claim 1, wherein the microelectromechanical acceleration sensor system is a microphone.

10. An electronic device, comprising:
a microelectromechanical acceleration sensor system, including:
a microelectromechanical acceleration sensor element configured to detect acceleration values acting on the microelectromechanical acceleration sensor element,
a sigma-delta analog-to-digital converter configured to convert analog output signals of the microelectromechanical acceleration sensor element into digital output signals of the microelectromechanical acceleration sensor system, and
a first signal generator element, and a second signal generator element, the first signal generator element being connected between the microelectromechanical acceleration sensor element and the sigma-delta analog-to-digital converter and being configured to apply a predetermined signal value to the analog output signals of the microelectromechanical acceleration sensor element, the predetermined signal value of the first signal generator element corresponding to an acceleration value that is greater than an average gravity acceleration, and the second signal generator element being connected in a signal processing direction downstream from the sigma-delta analog-to-digital converter and being configured to correct the digital output signals of the sigma-delta analog-to-digital converter by the predetermined signal value of the first signal generator element.

* * * * *